United States Patent
Lee

(12) 
(10) Patent No.: US 6,212,101 B1
(45) Date of Patent: Apr. 3, 2001

(54) HIGH-DENSITY NOR-TYPE FLASH MEMORY DEVICE AND A PROGRAM METHOD THEREOF

(75) Inventor: Doo-Sup Lee, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/620,020

(22) Filed: Jul. 20, 2000

(30) Foreign Application Priority Data

Jul. 22, 1999 (KR) .................................................. 99-29786

(51) Int. Cl.⁷ ..................................................... G11C 16/04

(52) U.S. Cl. ................................ 365/185.17; 365/185.18; 365/185.19; 365/185.24

(58) Field of Search ......................... 365/185.17, 185.19, 365/185.18, 185.24

(56) References Cited

U.S. PATENT DOCUMENTS 6,101,125 * 8/2000 Gorman ........................... 365/185.19

* cited by examiner

*Primary Examiner*—Huan Hoang
(74) *Attorney, Agent, or Firm*—Marger Johnson & McCollom, P.C.

(57) ABSTRACT

Disclosed herein is a program method of a flash memory device. In accordance with the program method, first, flash memory cells depending on the word/byte unit among flash memory cells of a memory cell array are selected. And then, the selected flash memory cells are sequentially programmed so as to have a predetermined threshold voltage which is less than a target threshold voltage. After this, the selected flash memory cells either are simultaneously programmed from the predetermined threshold voltage up to the target threshold voltage, or are divided into plural groups to be programmed sequentially. With this program algorithm, although the integration degree of the flash memory device is increased and power supply voltage level is lowered, a sufficient amount of current required to a program can be supplied without the increase of the size of an integrated circuit die.

17 Claims, 12 Drawing Sheets

HIGH-DENSITY NOR-TYPE FLASH MEMORY DEVICE AND A PROGRAM METHOD THEREOF

FIELD OF THE INVENTION

The present invention relates to flash memory devices, and more particularly to a high-density NOR-type flash memory device which operates at very low power supply voltage, and to a method of programming the memory device.

BACKGROUND OF THE INVENTION

Flash memories are commonly employed in a wide variety of computer systems to provide nonvolatile information storage. Conventional flash memories typically include program circuitry for programming information into the flash memory cells as well as erase circuitry for erasing the memory cells. However, the voltage levels required by such program and erase circuitry differ from the power supply voltage levels that are typically available from a computer system power supply voltage.

Some flash memories require multiple voltage supplies to accommodate the program and erase circuitry. For example, any flash memory requires a power supply voltage and a separate high voltage for the program circuitry. Unfortunately, such a requirement of dual voltage supplies typically increases the complexity of power system design for computer systems that employ such dual supply flash memories and increases the overall cost of such systems.

On the other hand, single power supply flash memories commonly contain specialized circuitry that generates the appropriate voltage levels and electrical current levels required to program and erase the individual flash memory cells. For example, such flash memories typically include charge pump circuitry that converts a single electrical supply voltage into the appropriate voltage level required to drive the inputs to the flash memory cells during programming.

More recent computer systems, such as portable computers, employ integrated circuits and other devices that function with relatively low power supply voltage levels in comparison to earlier systems. For example, conventional notebook computer systems that employed 5V power supply voltage are now evolving toward 3V or lower power supply voltages (for example, 2V or 1.5V).

Unfortunately, such low levels of electrical power supply voltages impose a practical limit on the amount of electrical programming current that can be generated by charge pump circuitry on the flash memory. Such a limit on available programming current may reduce the overall speed of such flash memories by limiting the number of flash cells that can be programmed simultaneously.

Theoretically, a larger and more complex implementation of charge pump circuitry would provide the necessary electrical current required to program entire bytes or words of flash memory cells simultaneously. If the voltage level of the power supply voltage is further reduced, for example, if it is lowered below 2V, the charge pump circuitry becomes much more complicated and much larger. Such large and complex charge pump circuitry consumes large areas of an integrated circuit die. Such large amounts of integrated circuit die space dedicated to charge pump typically reduces the area available for flash memory cells and associated access circuitry, which thereby limits the overall storage capacity of such a flash memory. On the other hand, such large amounts of die space may require a significant increase in the overall size of the integrated circuit die which increases manufacturing costs.

SUMMARY OF THE INVENTION

It is therefore an object of the present invention to provide a high-density NOR-type flash memory device capable of reducing the size of charge pump by minimizing maximum operating current consumed during programming, and to provide its programming method.

It is another object of the invention to provide a high-density NOR-type flash memory device which can shorten program time, and to provide its programming method.

In order to attain the above objects, according to an aspect of the present invention, there is provided a NOR-type flash memory device, which comprises an array of a plurality of memory cells arranged in rows and columns, a row-selecting circuit for selecting one of the rows, and a column-selecting circuit for selecting ones of a group among the columns. In the memory device, a pump circuit is provided which generates a drain voltage to be supplied to the selected columns during a program operation. Furthermore, the memory device provides a program period control circuit, a select circuit and a write driver circuit. The program period control circuit generates first and second program period signals indicating a program period of memory cells assigned by the selected row and columns. The select circuit generates select signals assigning the selected columns respectively in response to the first and second program period signals and data bits to be programmed to the assigned memory cells. And the write driver circuit drives the selected columns with the drain voltage from the pump circuit in response to the select signals.

In this embodiment, the program period control circuit generates the first program period signals each corresponding to the assigned memory cells so that the assigned memory cells are sequentially programmed up to a predetermined threshold voltage which is less than a target threshold voltage; and wherein the program period control circuit generates the second program period signal so that the assigned memory cells are simultaneously programmed up to the target threshold voltage from the predetermined threshold voltage.

In this embodiment, the first drain voltage has a different level from a second drain voltage, the first drain voltage being supplied to the selected columns during a first time when the assigned memory cells are programmed up to the predetermined threshold voltage, and the second drain voltage being supplied to the selected columns during a second time when the assigned memory cells are programmed up to the target threshold voltage from the predetermined threshold voltage.

In this embodiment, the second drain voltage is higher than the first drain voltage, and a unit program time of each of the selected memory cells is identical to a sum of the first time and the second time.

BRIEF DESCRIPTION OF THE DRAWINGS

The present invention will be described by way of exemplary embodiments, but not limitations, illustrated in the accompanying drawings in which like references denote similar elements, and in which.

DESCRIPTION OF THE PREFERRED EMBODIMENT

Hereinafter, the preferred embodiments according to the present invention will be more fully described with reference to the accompanying drawings.

Figure 1:
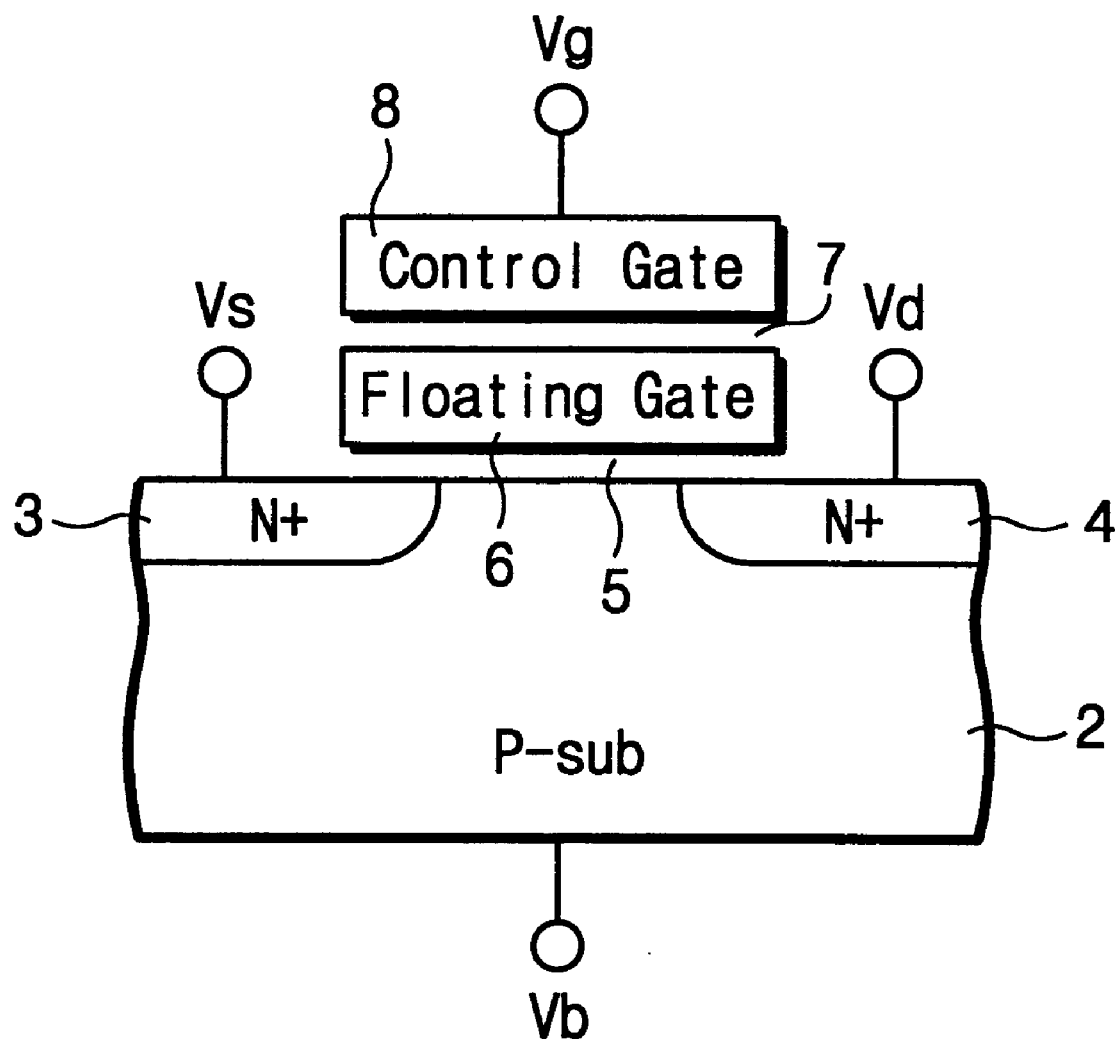
FIG. 1 is a cross-sectional diagram showing a conventional flash memory cell.

Referring to FIG. 1 which shows a cross-sectional diagram of a conventional flash memory cell, the flash memory cell has $N^+$-type source 3 and drain 4 formed in a P-type substrate 2, a floating gate 6 formed over a channel with a thin insulating layer 5 below 100A interposed therebetween, and a control gate 8 formed over the floating gate 6 with another insulting layer 7 interposed therebetween.

The flash memory cell in FIG. 1 is programmed by grounding the substrate 2 and the source region 3, applying a high voltage Vg of about +10V to the control gate 8 and a positive voltage Vd of about +5V~+6V to the drain 4. If a predetermined time elapses under this bias condition, a sufficient amount of negative charges are injected to the floating gate 6 from the channel adjacent to the drain 4. At this time, the floating gate 6 has (−) potential. This functions to increase a threshold voltage of the flash memory cell during a read operation. Such a state of the flash memory cell is named "off cell." When the positive voltage Vd of about +5V−+6V is applied to the drain 4 of the off cell, no cell current flows to the grounded source 3 from the drain 4. An erased state, that is, an un-programmed state, of the flash memory cell is named "on cell." When the positive voltage Vd of about +5V−+6V is applied to the drain 4 of the on cell, a cell current of about 200 $\mu$A flows to the source 3 from the drain 4, through the channel.

As is well known to ones skilled in the art, selected memory cells of a flash memory device, such as a NOR-type flash memory device, are programmed by the byte unit (composed of 8 data bits) or the word unit (composed of 16 data bits). When all data bits of the byte/word unit are simultaneously programmed, the maximum current of 1.6 mA (200 $\mu$A*8) is required when programmed by the byte unit, and the maximum current of 3.2 mA (200 $\mu$A*16) is required when programmed by the word unit. A very large charge pump is required in order to generate the voltage Vd of about +5V−+6V to be supplied to the drain 4 of the flash memory cell and simultaneously to supply the required high current (e.g., 1.6 mA or 3.2 mA). This, as set fourth above, makes such a charge pump consume a large area of an integrated circuit die. Such a large amount of integrated circuit die space dedicated to charge pump typically reduces the available for flash memory cells and associated access circuitry, which thereby limits the overall storage capacity of such a flash memory (it means that a size of the integrated circuit die is increased). Furthermore, when such high current is instantly consumed, power noise occurs, thereby potentially causing a malfunction of the flash memory device. As the power supply voltage level used in the NOR-type flash memory device is continually reduced with newer devices and processes, such a problem becomes more and more serious.

Figure 2:
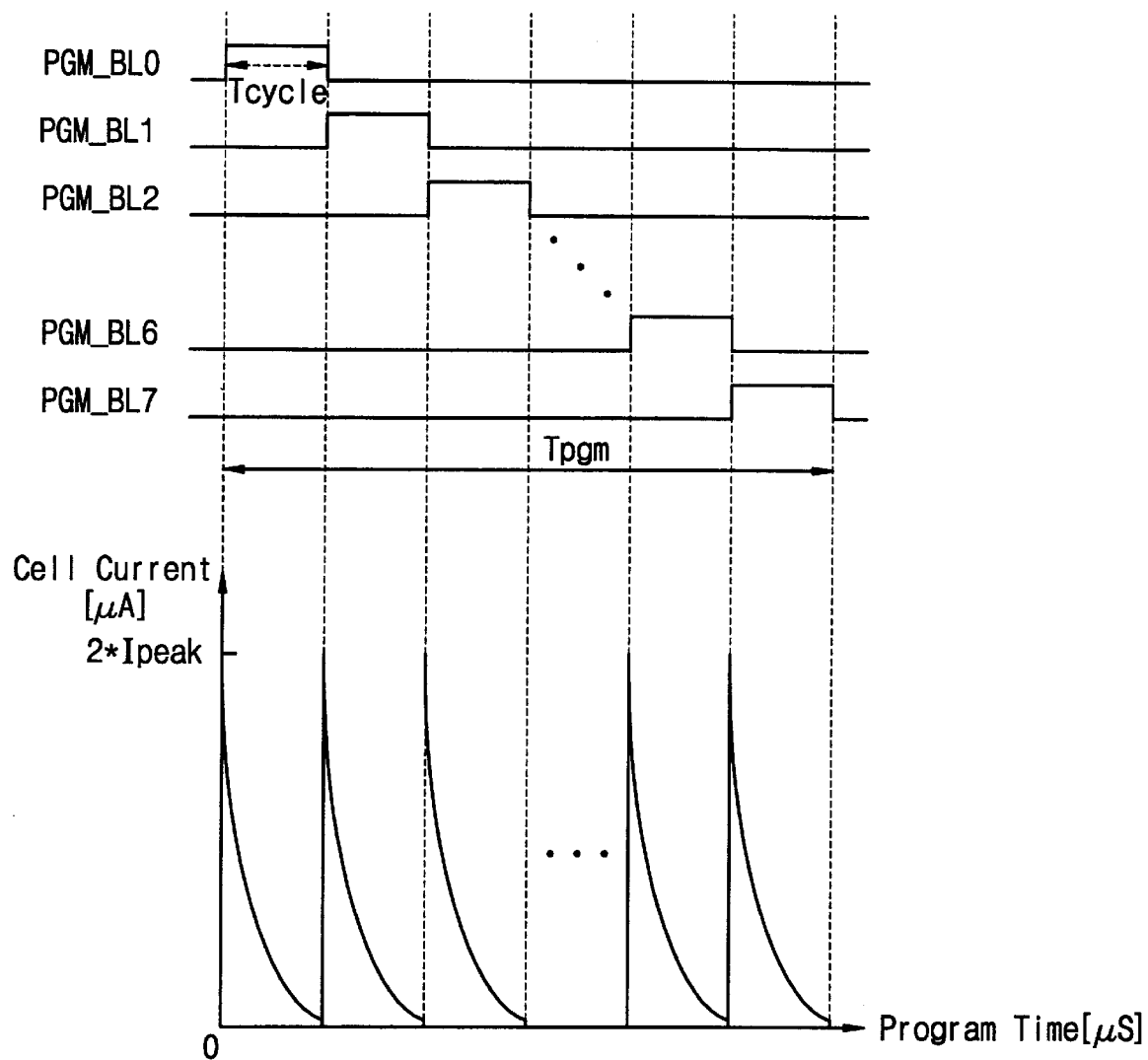
FIG. 2 corresponding to FIG. 1 is a diagram showing a relationship between cell current and program time when two data bits are simultaneously programmed via conventional methods.

According to a conventional program method for reducing the area dedicated for the charge pump, first, a plurality of data bits to be programmed are divided into plural groups. And then, data bits of each of the plural groups are simultaneously programmed in unit program time Tcycle (corresponding to a time required to program sufficiently up to a target threshold voltage of a flash memory cell). For example, in the case where each group includes two data bits, maximum current consumed in the unit program time Tcycle is reduced by 1/8, e.g. to about 400 $\mu$A, as compared with the above-described program method (i.e. a method by which all of the data bits of word unit are simultaneously programmed). The size of charge pump may be decreased in proportion to the maximum current thus reduced. Herein, assuming that peak current of a flash memory cell is symbolized by Ipeak, as illustrated in FIG. 2, the maximum current of the respective unit program time Tcycle corresponds to twice peak current (2*I peak). On the other hand, it can be seen that total program time Tpgm becomes eight times longer than in the above-described program method (e.g. if Tcycle=1$\mu$s, then Tpgm=1 $\mu$s*8=8 $\mu$s).

In the case that the NOR-type flash memory device operates at a very low power supply voltage (e.g. below 2.0V), a time may be longer which is required to generate current and voltage levels to be supplied to the drain of the flash memory cell during programming. On the other hand, in order to reduce the total program time, the size of the charge pump may be increased. In this case, the charge pump consumes a larger area of the integrated circuit die when the flash memory device is highly integrated. This means that large amounts of integrated circuit die space are dedicated to the charge pump, which reduces the area available for flash memory cells and associated access circuitry, thereby limiting the overall storage capacity of such a flash memory.

The First Embodiment

Figure 3:
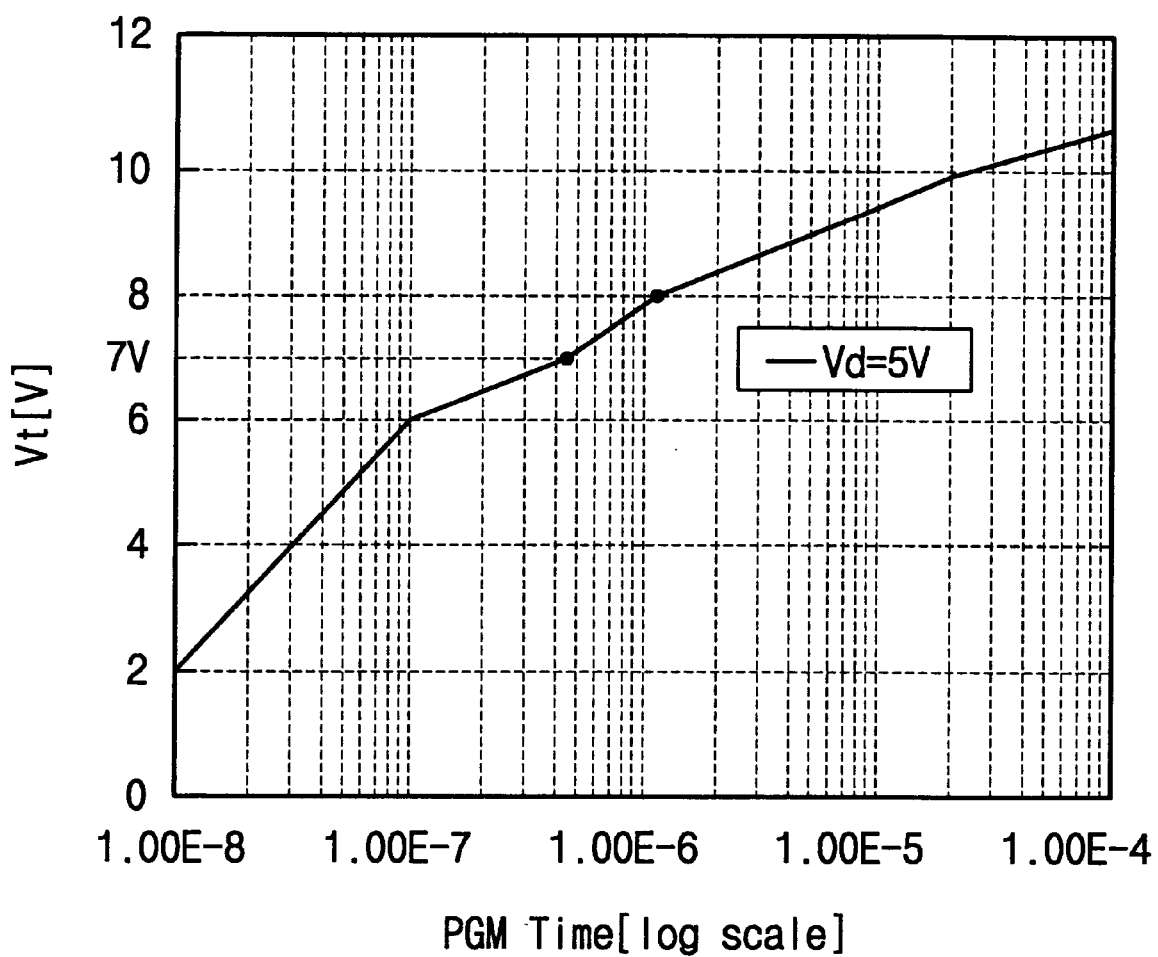
FIG. 3 is a diagram showing a relationship between a threshold voltage of a flash memory cell and program time during programming.

FIG. 3 is a diagram of showing the relationship between variations of program time and a cell's threshold voltage. In FIG. 3, a vertical axis indicates a threshold voltage Vth of a flash memory cell and a horizontal axis indicates program time (PGM Time) thereof which is illustrated by a log scale. Assume that a target threshold voltage Vth_pgm of the cell to be programmed is 8V, and that the unit program time Tcycle required to program the cell is 1 $\mu$s (1.00E-6). Under this condition, it can be seen from FIG. 3 that the threshold voltage Vth to the cell is increased up to about 7V (approximately 85% of the target threshold voltage Vth_pgm) in just under 0.5 $\mu$s. This will be appreciated to be approximately half of the unit program time Tcycle.

Figure 4:
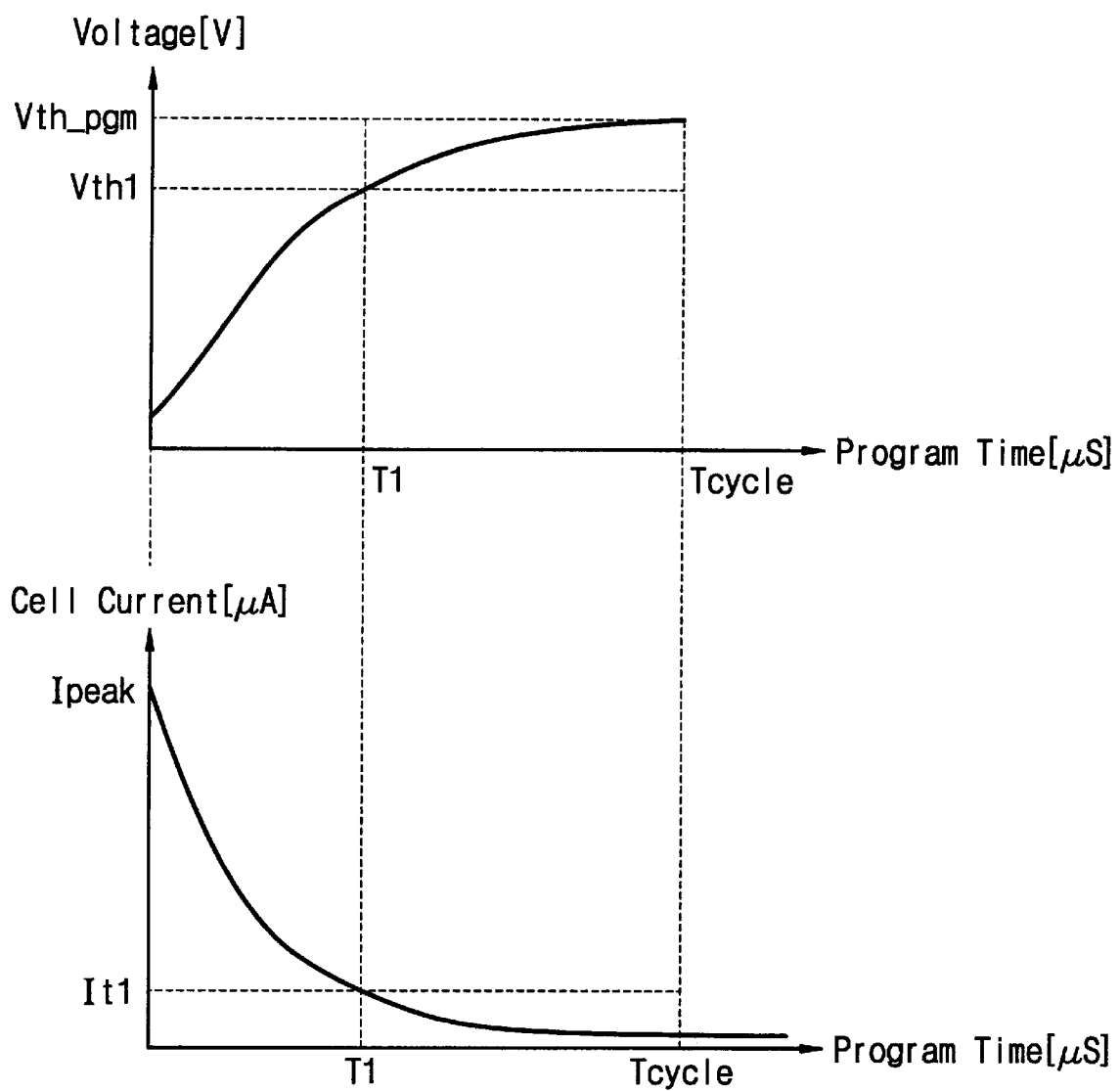
FIG. 4 is a diagram showing variations of a threshold voltage and cell current according to progam time.

FIG. 4 shows variations of the threshold voltage and the cell current depending on the program time. The threshold voltage Vth of the cell is sharply increased up to Vth1 during first program time 0-T1, while the cell current flowing through the programmed cell is sharply decreased (consumed) from Ipeak to It1 during the first program time. And then, during second program time T1-Tcycle, the threshold voltage Vth of the cell is slowly increased from Vth1 to Vth_pgm, and a small amount of cell current is consumed.

As seen from FIGS. 3 and 4, when the threshold voltage Vth of the flash memory cell is sharply increased at the incipient stage of the unit program time Tcycle, the cell current which flows from the drain to the source, via the channel, is sharply decreased. Herein, it is obvious to ones skilled in the art that the slope of the curve representing the rate at which the threshold voltage Vth is increased, depending on the characteristic of the flash memory cell, can be varied. This means that the first program time 0-T1 either becomes shorter or longer depending on the characteristic of the cell.

Figure 5:
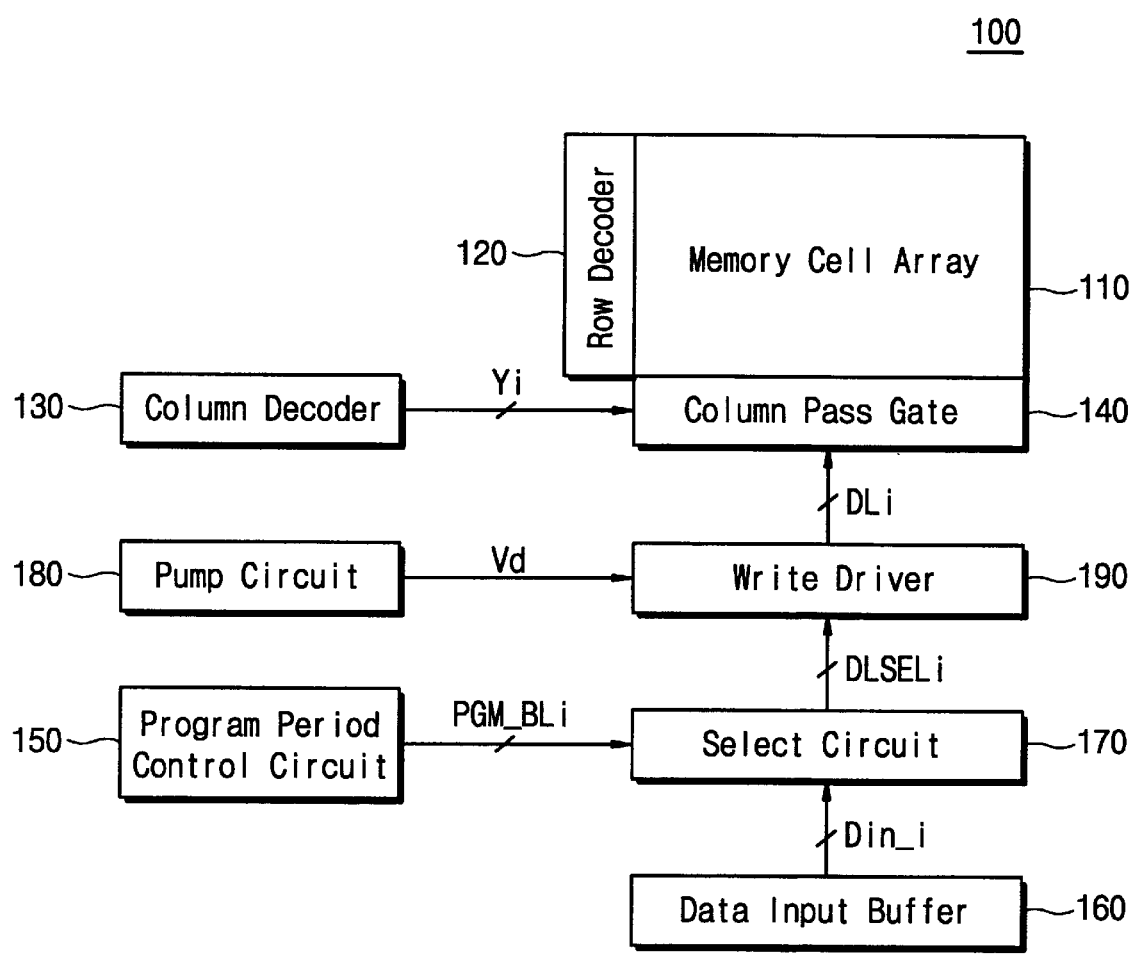
FIG. 5 is a block diagram showing a flash memory device according to a first embodiment of the present invention.

A block diagragm showing the NOR-type flash memory device according to the first embodiment is illustrated in FIG. 5. The NOR-type flash memory device 100 comprises a memory cell array 110, which includes (although not shown in FIG. 5), plural word lines extending along rows, plural bit lines extending along columns and plural flash memory cells (or EEPROM cells) each arranged at intersections of the word lines and the bit lines. One of the word lines is selected by a row decoder circuit 120 depending on a row address, and some of the bit lines are selected by a column decoder circuit 130 and a column pass gate circuit 140 depending on a column address. For example, in the case where memory cells are programmed by the byte unit, eight bit lines are selected by the column decoder circuit 130 and the column pass gate circuit 140. And, in the case where memory cells are programmed by the word unit, sixteen bit lines are selected by the column decoder circuit 130 and the column pass gate circuit 140. That is, 8/16 flash memory cells are selected which are arranged at intersections of the selected word line and the selected bit lines, respectively.

In the flash memory device 100, a program period control circuit 150, a data input buffer circuit 160, a select circuit 170, a pump circuit 180 and a write driver circuit 190 are further provided. Data bits of '0' or '1' to be programmed are temporarily stored in the data input buffer circuit 160 according to the byte/word unit. The program period control circuit 150 generates program period signals PGM_BLi (i=0–17) of a pulse form when a program operation for the selected memory cells is performed. In this embodiment, the program period control circuit 150, for example, comprises a counter.

Continuously, the select circuit 170 receives the program period signals PGM_BLi and the data bits lines Din_(i=0–15), and then produces data line select signals DLSELi (i=0–15) which select lines correspond to the selected bit lines, respectively. For example, when the first program period signal PGM_BL0 is activated and the first data bit Din_0 is to be programmed (for example, logic '0'), the first data line select signal DLSEL0 is activated. On the other hand, when the first program period signal PGM_BL0 is activated and the first data bit Din_0 is to be program-inhibited (for example, logic '1'), the first data line select signal DLSEL0 is inactivated. Other data line select signals DLSEL1 to DLSEL15 are activated or inactivated according to the above-described manner.

The pump circuit 180 provides the write driver circuit 190 with a drain voltage Vd and a current to be transferred to the selected bit line(s). The write driver circuit 190 supplies the selected bit lines with the drain voltage Vd and the current from the pump circuit 180 in response to the data line select signals DLSELi. An example of the pump circuit is disclosed in U.S. Pat. No. 5,642,309 entitled "AUTO-PROGRAM CIRCUIT IN A NONVOLATILE SEMICONDUCTOR MEMORY DEVICE", the disclosure of which is hereby incorporated by reference.

Assuming that the cells of the above-described NOR-type flash memory device 100 are programmed by the word unit, the program operation of the present invention will be more fully described below. However, the program method of the present invention can be applied to a flash memory device which is programmed depending on the byte unit. And the NOR-type flash memory device 100 supports a read-while-write (RWW) mode of operation in which a program operation and a read operation are simultaneously performed. The memory device of the RWW mode of operation is disclosed in U.S. Pat. No. 5,867,430 entitled "BANK ARCHITECTURE FOR A NON-VOLATILE MEMORY ENABLING SIMULTANEOUS READING AND WRITING", the disclosure of which is also hereby incorporated by reference.

Figure 6:
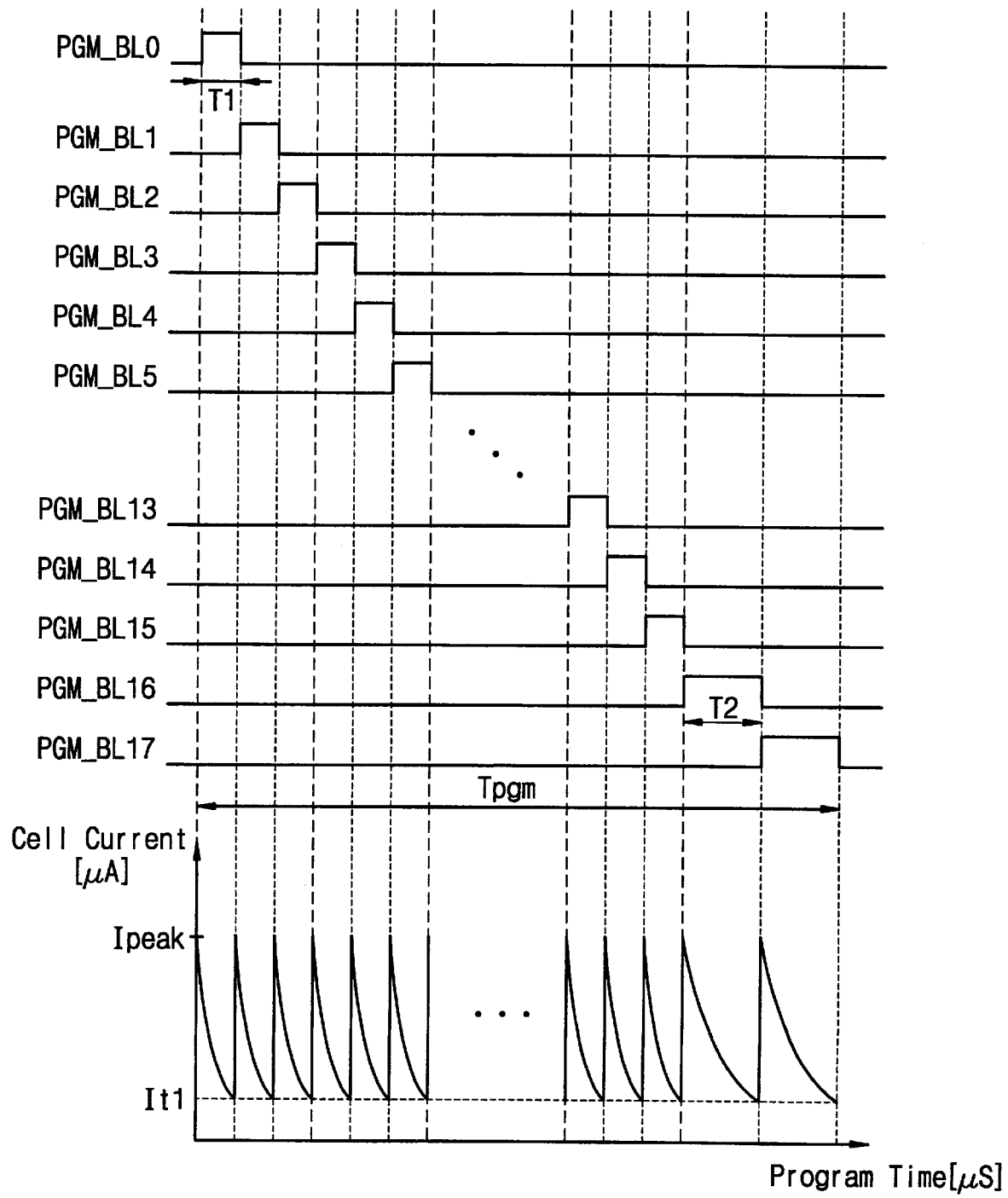
FIG. 6 is a diagram showing a relationship between cell current and program time according to the program method of the first embodiment.

FIG. 6 is a diagram showing the relationship between cell current and program time according to the program method of the first embodiment of the present invention. Prior to describing the program method of the present invention, the first program time T1 is defined as a time when the threshold voltage Vth of the flash memory cell reaches a threshold voltage Vth1 (e.g. 6V–7V) below the target threshold voltage Vth_pgm, and a second program time T2 is defined as the unit program time minus the first program time (Tcycle-T1) (Tcycle is a time required to program the flash memory cell sufficiently up to the target threshold voltage Vth_pgm).

Referring collectively to FIGS. 5 and 6, if the program operation starts, one of the word lines of the memory cell array 110 is selected by the row decoder circuit 120, and sixteen bit lines (of the word unit) are selected by the column decoder circuit 130 and the column pass gate circuit 140. As a result of the above-described operation, sixteen flash memory cells are selected which are arranged at intersections of the selected word line and the selected bit lines. Although not shown in FIG. 6, a high voltage of about 10V which, for example, is pumped from a well-known word line voltage generating circuit, may be provided to the selected word line to which control gates of the selected cells are coupled in common.

And then, when a first program period signal PGM_BL0 from the program period control circuit 150 transitions from low to high, the select circuit 170 receives the first program period signal PGM_BL0 and a first data bit Din_0 (e.g. logic '0'), and then activates a first data line select signal DLSEL0 in response thereto. The first data bit Din_0 is one of the data bits Din_0 to Din_15 which are stored in the data input buffer circuit 160 and are to be programmed. This forces the drain voltage Vd and the current from the pump circuit 180 to be supplied to a first bit line corresponding to the first data bit Din_0 through the write driver circuit 190 and the column pass gate circuit 140. As a result, a first flash memory cell starts to be programmed. At this time, as set forth above, the cell current flowing via the selected flash memory cell corresponds to the maximum current Ipeak of about 200 μA, and the first flash memory cell is programmed up to Vth1 below the target threshold voltage Vth_pgm during the first program time T1.

As illustrated in FIG. 6, after the signal PGM_BL0 is activated and the first program time T1 elapses, the first program period signal PGM_BL transitions from high to low (it is inactivated). At the same time, the program period control circuit 150 activates a second program period signal PGM_BL1 which indicates a program operation of a second data bit Din_1 of the data bits Din_0 to Din_15 to be programmed. The drain voltage Vd and the current from the pump circuit 180 are supplied to a second bit line corresponding to the second data bit Din_1 through the write driver circuit 190 and the column pass gate circuit 140. As a result, a second flash memory cell starts to be programmed. As this time, the cell current flowing via the selected flash memory cell corresponds to the maximum current Ipeak of about 200 μA, and the second flash memory cell is programmed up to the threshold voltage Vth1 during the first program time T1.

The selected flash memory cells corresponding to other data bits (for example, Din_2 to Din_15) are sequentially programmed up to the threshold voltage Vth1 in the same manner as the above-described program operation. After they are sequentially programmed up to the threshold voltage Vth1, the selected memory cells can be simultaneously programmed according to the capacity of the pump circuit 180. Or, after dividing the selected memory cells into tow or more groups, the groups of memory cells can be programmed according to the capacity of the pump circuit 180, respectively. In this embodiment, assuming that the current capacity of the pump circuit 180 equals to Ipeak (200 μA), the number N of data bits to be simultaneously programmed is determined by the current capacity of the pump circuit 180 and the cell current It1 which is consumed by the flash memory cell at the incipient stage of the second program time T2. If N=8, the sixteen selected memory cells are divided into two groups, and then the respective groups will be programmed as follows.

As shown in FIG. 6, when a program period signal PGM_BL 16 is activated high, data line select signals DLSEL0 to DLSEL7, each of which corresponds to one group of respective data bits, are simultaneously activated high by means of the select circuit 170. This makes the drain voltage Vd and the current from the pump circuit 180 be supplied to bit lines each corresponding to the activated signals DLSEL0 to DLSEL7. As a result, the memory cells coupled respectively to the driven bit lines are simultaneously programmed up to the target threshold voltage Vth_pgm from the threshold voltage Vth1 during the second program time T2 (Tcycle-T1). The flash memory cells corresponding to the data bits of other group bits will be programmed in the same manner as above described.

The program operation for the selected memory cells is ended in the above-described manner. According to the program method of the first embodiment, a total program time Tpgm is as follows.

$$T_{pgm-T}1 \times N + (T_{cycle-T}1) \times r$$

Herein, the symbol N indicates the number of data bits to be programmed (N=8 in the case of the byte unit, N=16 in the case of the word unit), the symbol r indicates the number of groups of flash memory cells, which is determined according to the current It1 and the maximum current Ipeak. For example, when Tcycle=1 μs, T1=0.5 μs, and r=2, the total program time Tpgm of the word unit is only 9 μs (0.5 μs*16+0.5 μs*2).

It can be seen from the above-described program algorithm that the maximum current consumed during the program operation of the first embodiment corresponds to the peak current Ipeak consumed by a flash memory cell. The size of the pump circuit 180 to be designed according to the program method of the first embodiment is halved as compared with the conventional method of programming two data bits at the same time. Therefore, according to the first embodiment of the invention, although the integration degree of the NOR-type flash memory device is increased and the power supply voltage level used in the memory device is lowered (e.g. below 2.0V), a sufficient amount of current to program the device can be supplied without an increment of the size of the integrated circuit die due to the pump circuit 180.

The Second Embodiment

Figure 7:
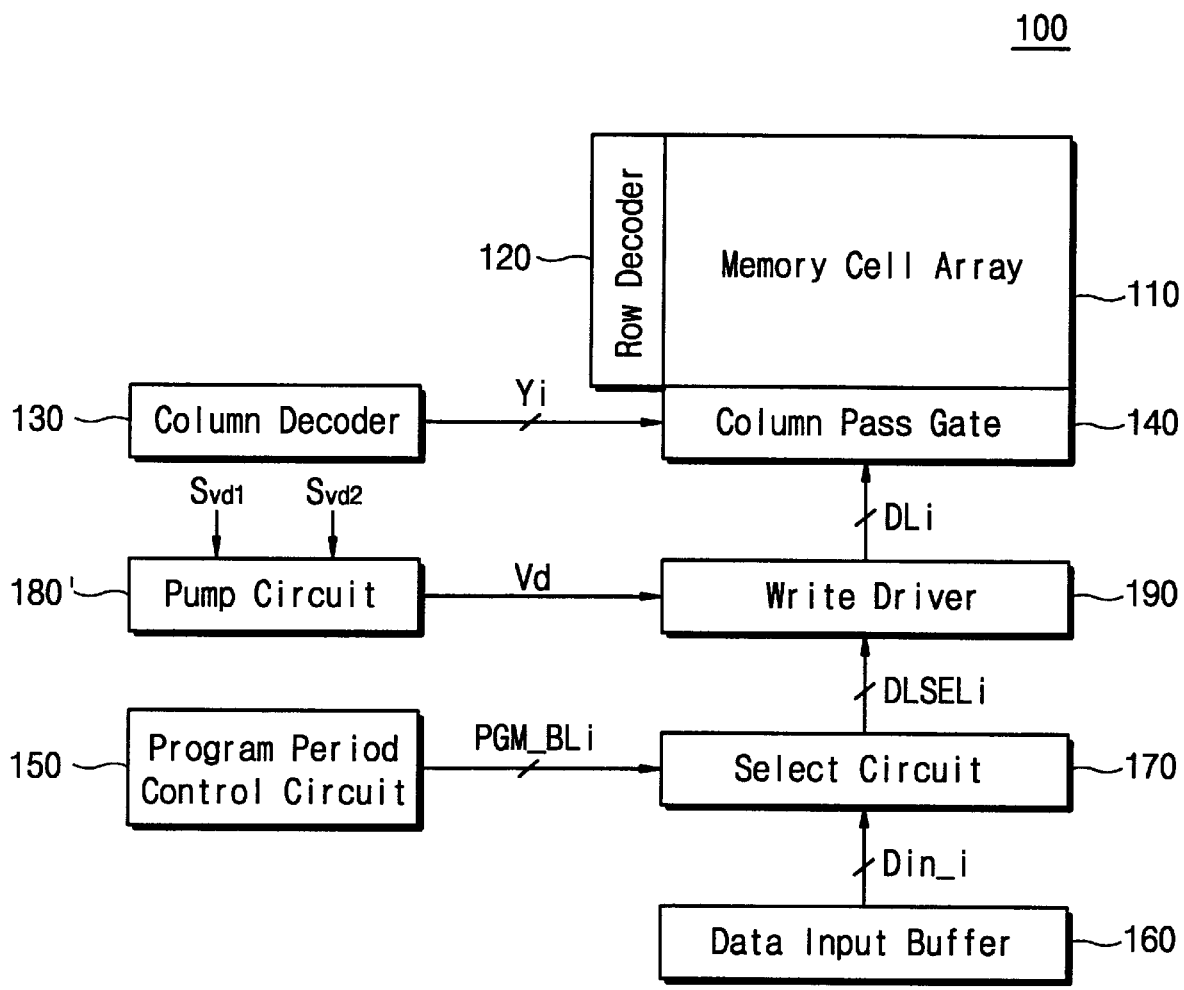
FIG. 7 is a block diagram showing a flash memory device according to a second embodiment of the present invention.

A block diagram showing the NOR-type flash memory device according to the second embodiment of the present invention is illustrated in FIG. 7. In FIG. 7, the constituent elements which are identical to those in FIG. 5 are labeled with the same reference numerals, and description thereof is thus omitted. The second embodiment differs from the first embodiment in the following respect. The drain voltage which is supplied to a bit line during the first program time T1 required to program a flash memory cell up to the threshold voltage Vth1 below the target threshold voltage Vth_pgm is different from the drain voltage which is supplied to the bit line during the second program time T2 required to program the flash memory cell up to the target threshold voltage Vth_pgm from the voltage Vth1.

Figure 8:
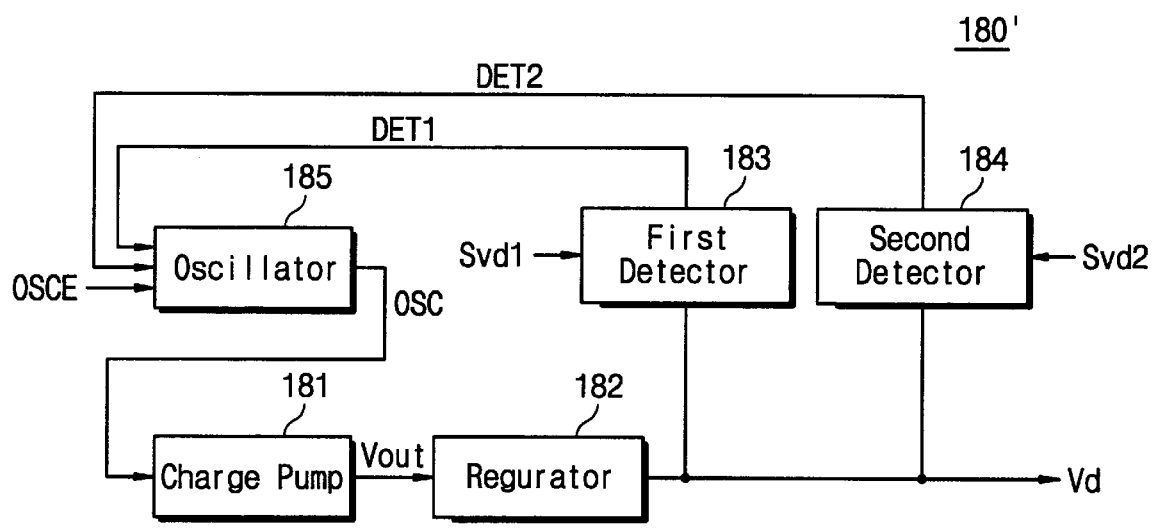
FIG. 8 is a block diagram showing a charge pump in FIG. 7.

Referring to FIGS. 7 and 8, the pump circuit 180' according to the second embodiment of the present invention supplies the write driver circuit 190 with the drain voltage Vd to be transferred to a bit line in response to control signals Svd1 and Svd2. In particular, a drain voltage Vd which is supplied to the write driver circuit 190 from the pump circuit 180' when the control signal Svd1 is activated is lower than a drain voltage Vd which is supplied to the write driver circuit 190 from the pump circuit 180' when the control signal Svd2 is activated. This will be more fully described below. The pump circuit 180' comprises a charge pump 181, a regulator 182, first and second detectors 183 and 184, and an oscillator 185 as illustrated in FIG. 8.

The charge pump 181 performs its pumping operation in response to an oscillator signal OSC from the oscillator 185, thereby producing a voltage Vout to be provided to a drain of a flash memory cell. The oscillator 185 operates in response to an oscillation enable signal OSCE. The charge pump 181 comprises serially-connected pump stages, such as disclosed in U.S. Pat. No. 5,280,420 entitled "CHARGE PUMP WHICH OPERATES ON A LOW VOLTAGE POWER SUPPLY", the disclosure of which is hereby incorporated by reference. The regulator 182 is to settle the unstable voltage Vout generated from the charge pump 181, and an output voltage from the regulator 182, i.e. a drain voltage Vd, is supplied to the write driver circuit 190. And then, when the control signal Svd1 is activated, the first detector 183 detects whether the output voltage Vd from the regulator 182 is higher than a predetermined voltage Vd1, e.g. 4.5V. If Vd>Vd1, the oscillator 185 is inactivated by the first detector 183 via signal DET1, so that the pumping operation of the charge pump 181 is stopped. Similarly, when the control signal Svd2 is activated, the second detector 184 detects whether the output voltage Vd of the regulator 182 is higher than a predetermined voltage Vd2, e.g. 5.5V. If Vd>Vd2, the oscillator 185 is inactivated by the second detector 184 via signal DET2, so that the pumping operation of the charge pump 181 is stopped.

Figure 9:
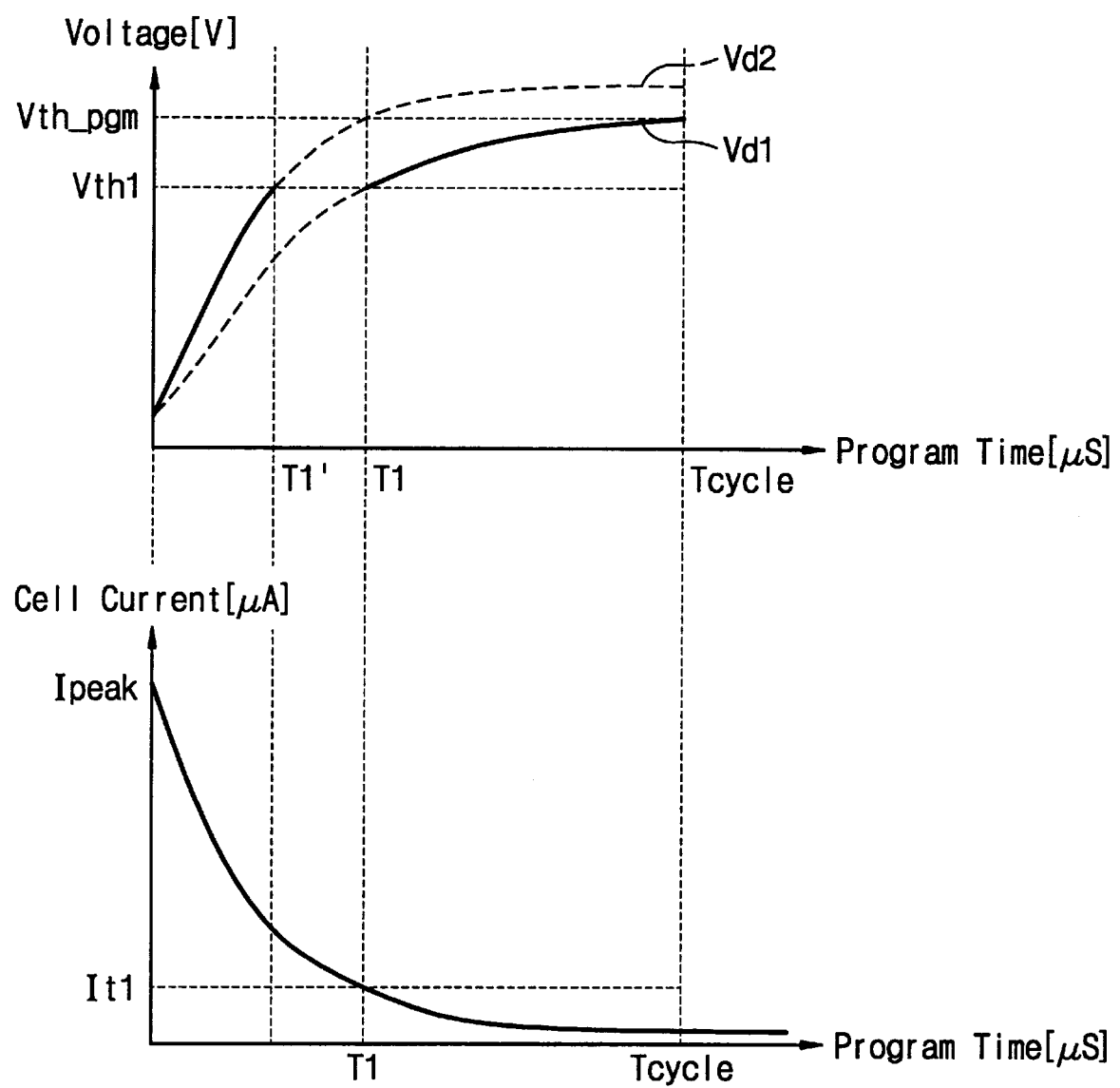
FIG. 9 is a diagram showing variations of a threshold voltage of a flash memory cell and program time in accordance with a variation of a drain voltage supplied to a bit line.

FIG. 9 shows the variation of the threshold voltage and the program time according to a voltage Vd variation supplied to a bit line. A first program time T1' required to program a flash memory cell up to a threshold voltage Vth1 when Vd=Vd2 (e.g. 5.5V), may be seen form FIG. 9 to be shorter than a program time T1 when Vd=Vd1 (e.g. 4.5V), corresponding to the first program time of the first embodiment. It may be seen that a total program time Tpgm can be shortened by increasing the voltage Vd provided to the drain of the flash memory cell. As illustrated in FIG. 9, cell current flowing via a flash memory cell when Vd=Vd2 also corresponds to the peak current Ipeak.

Figure 10A:
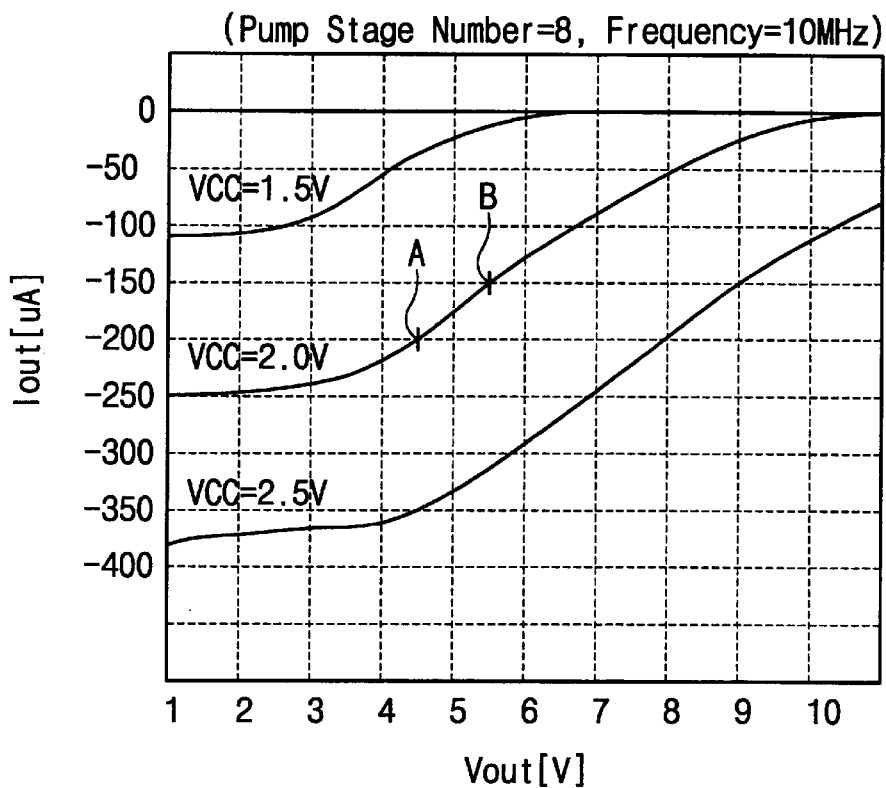
FIG. 10A is a diagram showing current supply capability of charge pump.

FIG. 10A shows the relationship between the current supply capacity of the charge pump versus output voltage therefrom. As the voltage Vout outputted from the charge pump 181 is increased, current Iout outputted from the pump 181 is decreased. For example, in the case where a power supply voltage is 2V and the charge pump 181 is composed of eight pump stages, when the output voltage Vout of the charge pump 181 is about 4.5V, the absolute value of the output current Iout is about 200 $\mu$A (refer to the point A). On the other hand, when the output voltage Vout is increased up to 5.5V, the absolute value of the output current Iout is decreased to about 150 $\mu$A (refer to the point B).

Figure 10B:
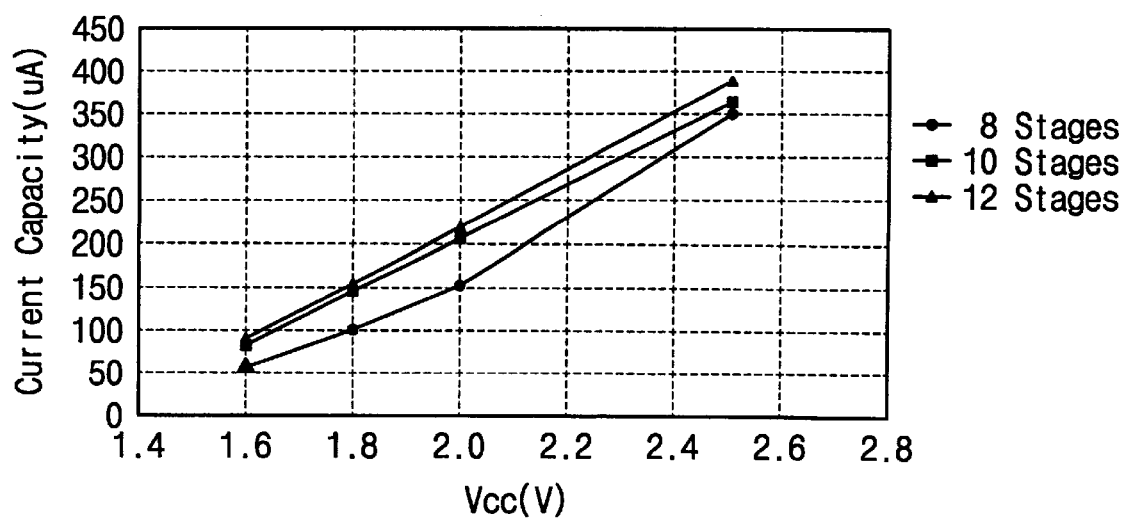
FIG. 10B is a diagram showing current variation in accordance with a power supply and the number of charge pump stages.
Figure 10C:
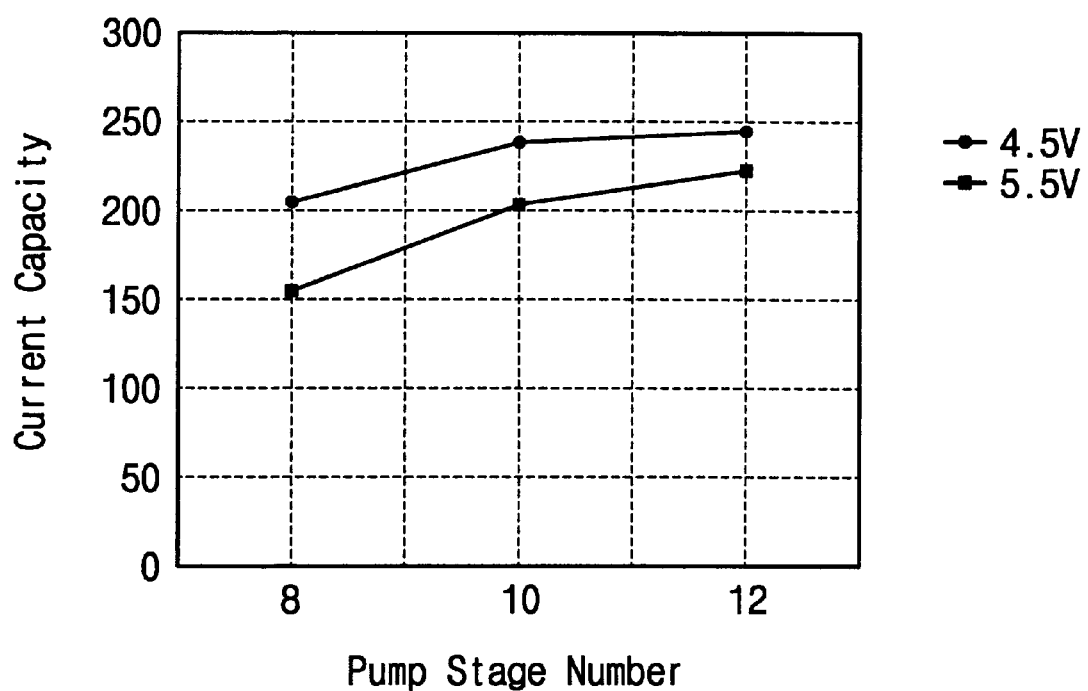
FIG. 10C is a diagram showing a current variation in accordance with the number of charge pump stages.

As described above, since the cell current flowing via the flash memory cell when Vd=Vd2 corresponds to the peak current Ipeak, the number of pump stages constituting the charge pump 181 according to the second embodiment has to be increased as compared with that according to the first embodiment. For example, in order to obtain the voltage Vout of about 5.5V and the current of about 200 $\mu$A, as seen from FIGS. 10B and 10C, the charge pump 181 may be composed of ten serially-connected pump stages. In this case, the charge pump 181 composed of ten pump stages can supply the current Iout of about 240 $\mu$A when Vd=Vd1. It means that the number of data bits to be simultaneously programmed during the second program time T2 (T1-Tcycle) becomes greater. On the other hand, the size of the charge pump 181 according to the second embodiment of the present invention is only slightly increased as compared with that according to the first embodiment of the present invention (the increased size of the pump 181 corresponds to only two added pump stages).

Figure 11:
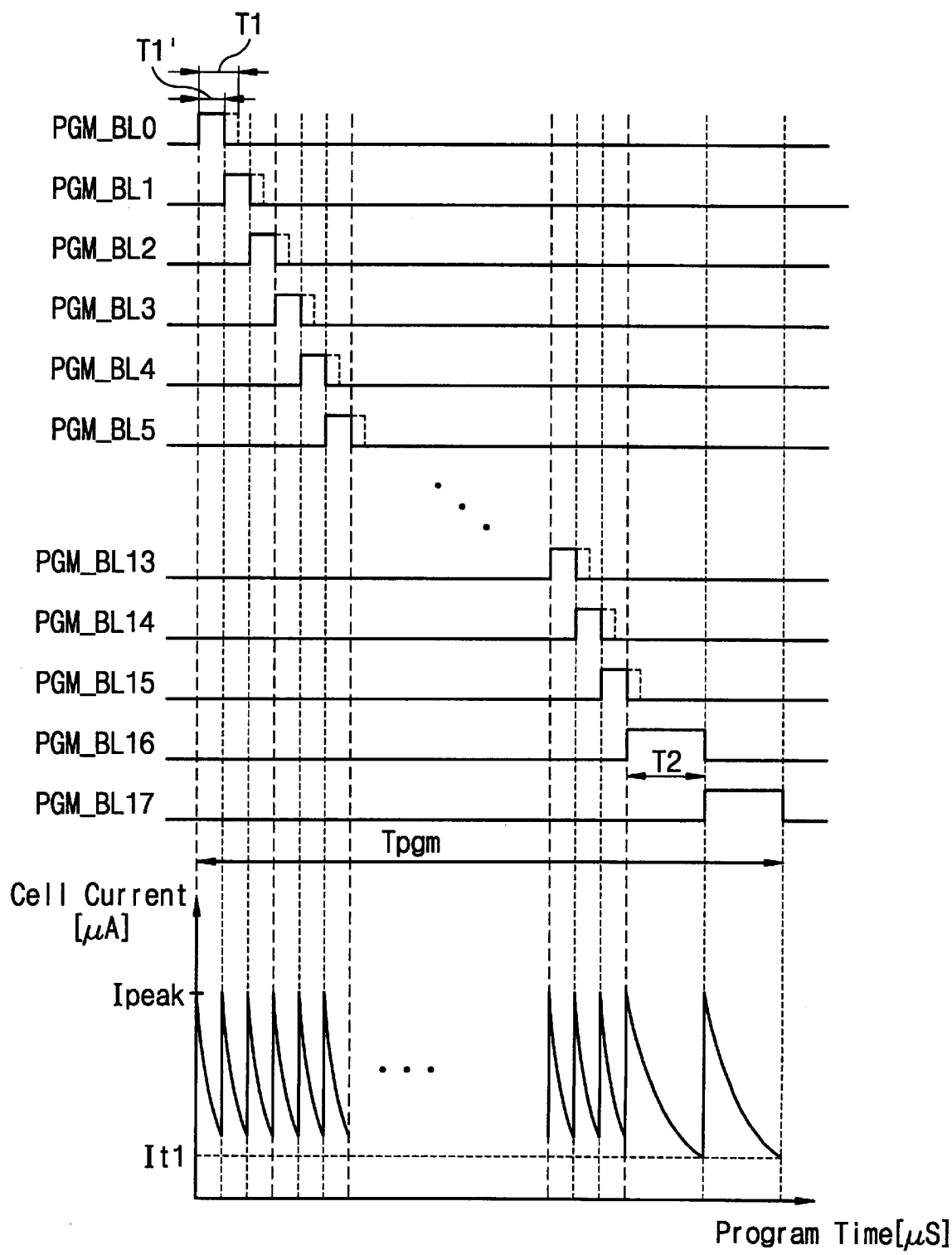
FIG. 11 is a diagram showing a relationship between cell current and program time according to the program method of the second embodiment.

FIG. 11 is a diagram showing the relationship between the cell current and the program time according to the second embodiment of the present invention. The program method according to the second embodiment will be more fully described below with reference to the accompanying drawings. Particular reference is made to FIG. 7.

When the program operation starts, one of the word lines of the memory cell array 110 is selected by the row decoder circuit 120, and sixteen bit lines (the word unit) are selected by the column decoder circuit 130 and the column pass gate circuit 140. As a result of the above-described operation, sixteen flash memory cells are selected which are arranged at intersections of the selected word line and the selected bit lines. Although not shown in the figures, a high voltage of about 10V which, for example, is pumped from a well-known word line voltage generating circuit, may be provided to the selected word line to which control gates of the selected cells are coupled in common.

And then, when a first program period signal PGM_BL0 from the program period control circuit 150 transitions from low to high, the select circuit 170 receives the first program period signal PGM_BL0 and a first data bit Din_0 (e.g. of logic '0'), and then activates a first data line select signal DLSEL0 in response thereto. The first data bit Din_0 is one of the data bits Din_0 to Din_15 which are stored in the data input buffer circuit 160 and are to be programmed. And, the pump circuit 180' generates a drain voltage Vd in response to the control signal Svd2. This forces the drain voltage Vd (=Vd2) and the current Iout from the pump circuit 180' to be supplied to a first bit line corresponding to the first data bit Din_0 through the write driver circuit 190 and the column pass gate circuit 140. As a result, a first flash memory cell starts to be programmed. At this time, the cell current flowing via the selected flash memory cell corresponds to the maximum current Ipeak of about 200 $\mu$A, and the first flash memory cell is programmed up to Vth1 below the target threshold voltage Vth_pgm during the first program time T1'. As set forth above, the time T1' is shorter than the time T1.

Continuously, as illustrated in FIG. 11, after the signal PGM_BL0 is activated and the first program time T1' elapses, the first program period signal PGM_BL0 transitions from high to low. At the same time, the program period control circuit 150 activates a second program period signal PGM_BL1 which indicates a program operation for a second data bit Din_1 of the data bits Din_0 to Din_15. This forces the drain voltage Vd (=Vd2) and the current Iout from the pump circuit 180' to be supplied to a second bit line corresponding to the second data bit Din_1 through the write driver circuit 190 and the column pass gate circuit 140. As a result, a second flash memory cell starts to be programmed. As this time, the cell current flowing via the selected flash memory cell corresponds to the maximum current Ipeak of about 200 $\mu$A, and the second flash memory cell is programmed up to Vth1 below the target threshold voltage Vth_pgm during the first program time T1'.

After this, flash memory cells corresponding to other data bits Din_2 to Din_15 will be programmed up to the threshold voltage Vth1 in sequence in the same manner as described above. After they are sequentially programmed up to the threshold voltage Vth1, the selected memory cells can be simultaneously programmed according to the capacity of the pump circuit 180'. Or, after dividing the selected memory cells into groups, each group of memory cells can be programmed according to the capacity of the pump circuit 180'. Assuming that the current capacity of the pump circuit 180' is the peak current Ipeak of about 240 $\mu$A, the number N of data bits to be simultaneously programmed is determined by the current capacity of the pump circuit 180' and the cell current It1 which is consumed by the flash memory cell at the incipient stage of the second program time T2 (Ipeak$\geq$It1*N). If N=16, the sixteen selected memory cells are simultaneously programmed. On the other hand, if N=8, the sixteen selected memory cells are divided into two groups of eight bits each, and then the respective groups will be programmed as follows.

As shown in FIG. 11, when a program period signal PGM_BL16 is activated high, data line select signals DLSEL0 to DLSEL7 each of which corresponds to one group of respective data bits are simultaneously activated high by means of the select circuit 170. And the pump circuit 180' generates the drain voltage Vd in response to the control signal Svd1. This makes the drain voltage Vd (=Vd1) (it is lower in level than the voltage Vd2 used in the first program time T1') and the current Iout (higher than that used in the first program time T1') from the pump circuit 180' be supplied to bit lines each corresponding to the activated signals DLSEL0 to DLSEL7. As a result, the memory cells coupled to the driven bit lines are simultaneously programmed up to the target threshold voltage Vth_pgm from the threshold voltage Vth1 during the second program time T2 (Tcycle minus T1). The flash memory cells corresponding to the data bits of the other group will be programmed in the same manner as above described.

The program operation for the selected memory cells is ended in the above-described manner. According to the program method of the first embodiment, a total program time Tpgm is as follows.

$$T_{pgm=T}1'\times N(T_{cycle}-T1)\times r'$$

Herein, the symbol N indicates the number of data bits to be programmed (N=8 in the case of the byte unit, N=16 in the case of the word unit), the symbol r' indicates the number of groups of flash memory cells, which is determined according to the current It1 and the maximum current Ipeak. For example, when Tcycle=1 $\mu$s, T1=0.5 $\mu$s, T1'=0.3 $\mu$s, and r'=2, the total program time Tpgm of the word unit is about 5.8 $\mu$s (0.3 $\mu$s*16+0.5 $\mu$s*2). As a result, the total program time Tpgm of the second embodiment is shortened by {(T1−T1')16+Tcycle(r−r')} as compared with that of the first embodiment, wherein the symbol r' indicates the number of groups of flash memory cells to be simultaneously programmed according to the second embodiment.

It can be seen from the above-described program algorithm that the maximum current consumed during the program operation of the first embodiment corresponds to the peak current Ipeak consumed by a flash memory cell. The size of the pump circuit 180' to be designed according to the program method of the second embodiment is considerably reduced as compared with the conventional method of programming two data bits at the same time. As a result, although the integration degree of the NOR-type flash memory device is increased and the power supply voltage used in the memory device is lowered, a sufficient amount of current required to program can supply without an increment of the size of the integrated circuit die due to the pump circuit 180'. Furthermore, as mentioned above, a total program time according to the program method of the second embodiment can be shortened considerably as compared with the conventional method.

As set forth above, since the NOR-type flash memory device has the RWW mode of operation, the program operation for one bank is performed, and the read operation for another bank is performed. It is obvious to ones skilled in the art that power noise is caused when the high voltage Vd and the drain current are generated from the pump circuit. The power noise caused during the programming affects the read operation which is performed in the another bank. Therefore, it is desirable that the maximum value of drain current causing the power noise is lessened as described and illustrated herein. Accordingly, the maximum current causing the power noise can be minimized by using the program methods according to the first and second embodiments.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A program method for use in a flash memory device which comprises an array of a plurality of memory cells arranged in rows and columns, the program method comprising;
   a first step of selecting at least two ones of the memory cells;
   a second step of sequentially programming the selected memory cells up to a predetermined threshold voltage during a first time, the predetermined threshold voltage being less than a target threshold voltage; and
   a third step of simultaneously programming the selected memory cells from the predetermined threshold voltage up to the target threshold voltage during a second time after sequentially programming the selected memory cells up to the predetermined threshold voltage.

2. The program method according to claim 1, wherein the flash memory device is of a NOR type.

3. The program method according to claim 2, wherein columns corresponding to the selected memory cells are supplied with a drain voltage of a different level at the second step and at the third step.

4. The program method according to claim 3, wherein a drain voltage supplied respectively to the columns corresponding to the selected memory cells at the second step is higher than that at the third step.

5. The program method according to claim 3, wherein a drain voltage supplied respectively to the columns corresponding to the selected memory cells at the second step is substantially identical to that at the third step.

6. The program method according to claim 1, further comprising;
   a fourth step of dividing into at least two groups the selected memory cells which have the predetermined threshold voltage, respectively; and
   a fifth step of sequentially programming the groups of the selected memory cells during a second time, wherein the selected memory cell of each group are simultaneously programmed.

7. The program method according to claim 6, wherein columns corresponding to the selected memory cells are supplied with a drain voltage of a different level at the second step and at the third step.

8. The program method according to claim 7, wherein a drain voltage supplied respectively to columns corresponding to the selected memory cells at the second step is higher than that at the fifth step.

9. The program method according to claim 8, wherein a drain voltage supplied respectively to the columns corresponding to the selected memory cells at the second step is substantially identical to that at the fifth step.

10. The program method according to claim 6, wherein a unit program time of each memory cell is substantially identical to a sum of the first time and the second time.

11. A NOR-type flash memory device comprising:
   an array of a plurality of memory cells arranged in rows and columns;
   a row selecting circuit for selecting one of the rows;
   a column selecting circuit for selecting one or more of a group of the columns;
   a pump circuit for generating a drain voltage to be supplied to the selected group of columns during a program operation;
   a program period control circuit for generating first and second program period signals indicating a program period of memory cells assigned by the selected row and column group;
   a select circuit for generating select signals assigning the selected column group respectively in response to the first and second program period signals and data bits to be programmed to the assigned memory cells; and
   a write driver circuit for driving the selected column group with the drain voltage from the pump circuit in response to the select signals, wherein the program period control circuit generates the first program period signals each corresponding to the assigned memory cells so that the assigned memory cells are sequentially programmed up to a predetermined threshold voltage which is less than a target threshold voltage; and wherein the program period control circuit generates the second program period signal so that the assigned memory cells are simultaneously programmed up to the target threshold voltage from the predetermined threshold voltage.

12. The NOR-type flash memory device according to claim 11, wherein a first drain voltage has a different level from a second drain voltage, the first drain voltage being supplied to the selected column group during a first time when the assigned memory cells are programmed up to the predetermined threshold voltage, and the second drain voltage being supplied to the selected column group during a second time when the assigned memory cells are programmed up to the target threshold voltage from the predetermined threshold voltage.

13. The NOR-type flash memory device according to claim 12, wherein the second drain voltage is higher than the first drain voltage.

14. The NOR-type flash memory device according to claim 12, wherein a unit program time of each of the selected memory cells is substantially identical to a sum of the first time and the second time.

15. A NOR-type flash memory device comprising:

an array of a plurality of memory cells arranged in rows and columns;

a row selecting circuit for selecting one of the rows;

a column selecting circuit for selecting ones of the columns into a column group;

a pump circuit for generating a drain voltage to be supplied to the column group during a program operation;

a program period control circuit for generating first and second program period signals indicating a program period of memory cells assigned by the selected row and column group;

a select circuit for generating select signals assigning the column group respectively in response to the first and second program period signals and data bits to be programmed to the assigned memory cells; and a write driver circuit for driving the column group with the drain voltage from the pump circuit in response to the selected signals, wherein the program period control circuit generates the first program period signals each corresponding to the assigned memory cells so that the assigned memory cells are sequentially programmed up to a predetermined threshold voltage which is less than a target threshold voltage; and wherein the program period control circuit generates the second program period signals so that plural groups of the assigned memory cells each having the predetermined threshold voltage are sequentially programmed, the assigned memory cells of each group being simultaneously programmed.

16. The NOR-type flash memory device according to claim 15, wherein a first drain voltage has a different level from a second drain voltage, wherein the first drain voltage is supplied to the selected columns during a first time when the assigned memory cells are programmed up to the predetermined threshold voltage, wherein the second drain voltage is supplied to the column group during a second time when the assigned memory cells are programmed up to the target threshold voltage from the predetermined threshold voltage, and wherein an unit program time of each assigned memory cell is substantially identical to a sum of the first time and the second time.

17. The NOR-type flash memory device according to claim 16, wherein the second drain voltage is higher than the first drain voltage.

* * * * *

UNITED STATES PATENT AND TRADEMARK OFFICE
CERTIFICATE OF CORRECTION

PATENT NO. : 6,212,101 B1
DATED : April 3, 2001
INVENTOR(S) : Lee

Page 1 of 1

It is certified that error appears in the above-identified patent and that said Letters Patent is hereby corrected as shown below:

Column 4,
Line 8, "available" should read -- availability --.
Line 62, "to the cell" should read -- of the cell --.

Column 7,
Line 23, "tow" should read -- two --.
Line 54, "$T_{pgm=T}1 \times N+(T_{cycle-T}1) \times r$" should read -- $T_{pgm=}T1 \times N+(T_{cycle-}T1) \times r$ --.

Column 9,
Line 2, "form" should read -- from --.

Column 10,
Line 25, "As" should read -- At --.
Line 45, " " should read -- $\geq$ --.

Column 11,
Line 5, "$T_{pgm=T}1' \times N+(T_{cycle-T}1) \times r'$" should read -- $T_{pgm=}T1' \times N+(T_{cycle-}T1) \times r'$ --.

Signed and Sealed this

Second Day of April, 2002

*Attest:*

*Attesting Officer*

JAMES E. ROGAN
*Director of the United States Patent and Trademark Office*